(12) United States Patent
Malisic et al.

(10) Patent No.: US 12,222,844 B2
(45) Date of Patent: Feb. 11, 2025

(54) SYSTEMS AND METHODS FOR TESTING VIRTUAL FUNCTIONS OF A DEVICE UNDER TEST

(71) Applicant: ADVANTEST CORPORATION, Tokyo (JP)

(72) Inventors: Srdjan Malisic, San Jose, CA (US); Chi Yuan, San Jose, CA (US)

(73) Assignee: Advantest Corporation, Tokyo (JP)

( * ) Notice: Subject to any disclaimer, the term of this patent is extended or adjusted under 35 U.S.C. 154(b) by 68 days.

(21) Appl. No.: 18/113,934

(22) Filed: Feb. 24, 2023

(65) Prior Publication Data

US 2024/0175916 A1 May 30, 2024

Related U.S. Application Data (60) Provisional application No. 63/440,003, filed on Jan. 19, 2023, provisional application No. 63/429,056, filed on Nov. 30, 2022.

(51) Int. Cl.
| | |
|---|---|
| *G06F 11/00* | (2006.01) |
| *G01R 31/28* | (2006.01) |
| *G06F 3/06* | (2006.01) |
| *G06F 11/36* | (2006.01) |

(52) U.S. Cl.
CPC ........ *G06F 11/3668* (2013.01); *G01R 31/287* (2013.01); *G06F 3/0607* (2013.01); *G06F 11/36* (2013.01); *G06F 3/0679* (2013.01)

(58) Field of Classification Search
CPC .............. G06F 11/36; G06F 11/3668
See application file for complete search history.

(56) References Cited

U.S. PATENT DOCUMENTS

| | | | |
|---|---|---|---|
| 2010/0115257 A1* | 5/2010 | Hoang | G06F 11/1666 717/174 |
| 2014/0298335 A1* | 10/2014 | Regev | G06F 11/261 718/1 |
| 2015/0095712 A1 | 4/2015 | Han | |
| 2015/0339216 A1* | 11/2015 | Wade | G06F 11/3664 714/38.1 |
| 2017/0090987 A1* | 3/2017 | Hearn | G06F 13/362 |
| 2017/0324803 A1* | 11/2017 | Shaath | G06F 11/36 |
| 2018/0357099 A1* | 12/2018 | Browne | G06F 9/45504 |
| 2019/0294528 A1* | 9/2019 | Avisror | G06F 11/3688 |
| 2020/0285565 A1* | 9/2020 | Jayaraman | G06F 11/3688 |
| 2021/0208909 A1* | 7/2021 | Lampka | G05B 19/0426 |
| 2024/0111446 A1* | 4/2024 | Paramesh | G06F 3/0679 |

FOREIGN PATENT DOCUMENTS

| | | |
|---|---|---|
| TW | 201638778 A | 11/2016 |
| TW | 202146923 A | 12/2021 |

\* cited by examiner

*Primary Examiner* — Joshua P Lottich (57) ABSTRACT

Embodiments of the present invention can provide an extended NVMe driver that supports exercising virtual functions (and related physical functions) of a DUT without using a VM or hypervisor. In this way, the amount of memory and processing resources used for testing NVMe SSDs can be significantly reduced, and a large number of DUTs (e.g., up to 16 DUTs) can be tested in parallel independently. In other words, each DUT is tested in isolation, as if is the only device being tested, and there are no race conditions or competition for resources between workloads during testing.

21 Claims, 7 Drawing Sheets

SYSTEMS AND METHODS FOR TESTING VIRTUAL FUNCTIONS OF A DEVICE UNDER TEST

The present invention claims priority and benefit of: U.S. Provisional Patent Application No. 63/440,003, entitled "Systems And Methods For Testing Virtual Functions Of A Device Under Test," filed on Jan. 19, 2023, and U.S. Provisional Patent Application No. 63/429,056, entitled "TESTING OF NVME DEVICES HAVING VIRTUALIZATION CAPABILITIES, AKA LOW OVERHEAD TESTING OF VIRTUALIZED DUTS WITHOUT A VIRTUAL MACHINE (VM) ON THE HOST SYSTEM," filed on Nov. 30, 2022, the entire content of which are herein incorporated by reference for all purposes.

FIELD

Embodiments of the present invention generally relate to the field of device testing. More specifically, embodiments of the present invention relate to methods and systems for testing virtual functions of a device under test (DUT).

BACKGROUND

A device or equipment under test is typically tested to determine the performance and consistency of the device before the device is sold. For example, a DUT can be tested using a large variety of test cases, and the result of the test cases can be compared to an expected output result. When the result of a test case does not match a satisfactory value or range of values, the device can be considered a failed device or outlier, and the device can be binned based on performance, etc.

A DUT is usually tested by automatic or automated test equipment (ATE), which may be used to conduct complex testing using software and automation to improve the efficiency of testing. The DUT may be any type of semiconductor device, wafer, or component that is intended to be integrated into a final product, such as a computer, network interface, or solid-state drive (SSD). By removing defective or unsatisfactory chips at manufacture using ATE, the quality of the yield can be significantly improved.

Recently, new SSD protocols such as Non-Volatile Memory Express (NVMe) have advanced the capabilities of modern storage devices. For example, some NVMe SSDs support virtual functions, that provide an interface to virtual machines (VM) managed by a hypervisor that isolates operating system and resources from the virtual machines and enables the creation and management of VMs. Unfortunately, existing approaches to testing NVMe SSDs are unable to test a large number of virtual functions at the same time due to resource limitations. Testing virtual functions by executing virtual machines typically requires significant overhead (e.g., memory requirements and CPU requirements) to simulate the virtual environment for testing the DUT. For these reasons, testing virtual functions of DUTs using VMs is a relatively slow and inefficient process. An improved approach to testing virtual functions of a device (e.g., an NVMe SSD) is desired.

SUMMARY

Accordingly, what is needed is an approach to testing devices that can test a large number of virtual functions in parallel across multiple devices. Embodiments of the present invention can provide an extended NVMe driver that supports exercising virtual functions (and related physical functions) of a DUT without using a VM or hypervisor. In this way, the amount of memory and processing resources used for testing NVMe SSDs can be significantly reduced, and a large number of DUTs (e.g., up to 16 DUTs) can be tested in parallel independently. In other words, each DUT is tested in isolation, as if it is the only device being tested, and there are no race conditions or competition for resources between the workloads during testing.

According to one embodiment, a tester system for testing a plurality of DUT virtual functions of a plurality of DUTs is disclosed. The tester system includes a host computer system including a memory, and the memory includes a plurality of test program processes operable to execute concurrently. A respective test program process of the plurality of test program processes is associated with each DUT of the plurality of DUTs, and each test program process includes a plurality of threads for generating workloads for testing DUT virtual functions of an associated DUT. The tester system further includes a plurality of driver instances instantiated within the memory, each driver instance of the plurality of driver instances operable to enable testing of an associated DUT virtual function on the plurality of DUTs, and each driver instance includes data structures for each DUT to enable testing of the respective DUT virtual function on the plurality of DUTs. The driver instances are operable to simulate a virtualization environment for the plurality of test program processes on the host computer system to test DUT virtual functions of the plurality of DUTs separately, independently and concurrently where any given test program process of the plurality of test program processes appears to be the sole user operating on the host computer system at any given time.

According to some embodiments, each data structure of each driver instance of the plurality of driver instances operates to locate and enable its associated DUT virtual function on an associated DUT, and present access to the DUT virtual function on the associated DUT to the host computer system and is used by a test program process of the host computer system to access and test the associated DUT virtual function on the associated DUT.

According to some embodiments, for a given test program process and an associated DUT and a given DUT virtual function of the associated DUT, workloads of the given test program process access and test the given DUT virtual function through a driver instance, of the plurality of driver instances, associated with the given DUT virtual function.

According to some embodiments, each driver instance of the host computer system further includes a controller handler, an interrupt handler, a queue for sending commands to a particular virtual function of a particular DUT, a queue for receiving responses back from the particular virtual function of the particular DUT, and computer resources for implementing the queues.

According to some embodiments, the plurality of DUTs are solid state drives (SSDs).

According to some embodiments, the plurality of driver instances are NVMe device driver instances.

According to some embodiments, the driver instances of the host computer system simulate functionality of a hypervisor.

According to some embodiments, host computer system is free of virtual machine software.

According to another embodiment, a tester system for testing a plurality of virtual functions of different DUTs is disclosed. The tester system includes a host computer system including a memory having a first and a second test program process operable to execute concurrently and where the first test program process is operable to test virtual functions of the first DUT. The second test program process is operable to test virtual functions of the second DUT, and the first test program process includes a first plurality of threads for generating workloads to test the virtual functions of the first DUT. The second test program process includes a second plurality of threads for generating workloads to the test virtual functions of the second DUT. The tester system further includes a plurality of driver instances instantiated within its memory, where each driver instance is operable to enable testing of an associated virtual function on the first and second DUTs. Further, each driver instance includes a first data structure for testing the associated virtual function on the first DUT and a second data structure for testing the associated DUT virtual function on the second DUT. The driver instances are operable to simulate a virtualization environment on the host computer system for the first and second test program processes to test virtual functions of the first and second DUTs separately, independently and concurrently, where each test program process of the first and second test program processes appears to be the sole test program process operating on the host computer system.

According to some embodiments, the first data structure of each driver instance of the plurality of driver instances operates to locate and enable an associated virtual function on the first DUT, and present access to the associated virtual function on the first DUT to the host computer system and is used by the first test program process of the host computer system to access and test the associated virtual function on the first DUT.

According to some embodiments, the second data structure of each driver instance of the plurality of driver instances operates to locate and enable an associated virtual function on the second DUT, and present access to the associated virtual function on the second DUT to the host computer system and is used by the second test program process of the host computer system to access and test the associated virtual function on the second DUT.

According to some embodiments, each driver instance of the host computer system further includes a controller handler, an interrupt handler, a first queue for sending commands to a particular virtual function of a particular DUT, a second queue for receiving responses back from the particular virtual function of the particular DUT, and computer resources for implementing the first and second queues.

According to some embodiments, the first and second DUTs include solid state drives (SSDs).

According to some embodiments, the plurality of driver instances include NVMe device driver instances.

According to some embodiments, the plurality of driver instances of the host computer system simulate functionality of a hypervisor.

According to some embodiments, the host computer system is free of virtual machine software.

According to a different embodiment, a method of testing a plurality of DUT virtual functions of a plurality of DUTs using a tester system is disclosed. The method includes, on a host computer system including a memory, concurrently executing a plurality of test program processes where a respective test program process of the plurality of test program processes is associated with each DUT of the plurality of DUTs and where further, each test program process of the plurality of test program processes includes a plurality of threads for generating workloads for testing DUT virtual functions of an associated DUT, and simulating a virtualization environment for the plurality of test program processes on the host computer system using a plurality of device driver instances instantiated within the memory, where the plurality of DUT virtual functions are operable to be tested on the plurality of DUTs separately, independently and concurrently within the virtualization environment and where any given test program process of the plurality of test program processes appears to be the sole user operating on the host computer system at any given time. Each driver instance of the plurality of driver instances is operable to enable testing of an associated DUT virtual function on the plurality of DUTs, and where further each driver instance of the plurality of driver instances includes a plurality of data structures, a respective data structure for each DUT of the plurality of DUTs, to enable testing of the respective DUT virtual function on the plurality of DUTs.

According to some embodiments, the method includes using each data structure of each driver instance of the plurality of driver instances for locating and enabling its associated DUT virtual function on an associated DUT, and presenting access to the DUT virtual function on the associated DUT to the host computer system and is used by a test program process of the host computer system to access and test the associated DUT virtual function on the associated DUT.

According to some embodiments, for a given test program process and an associated DUT and a given DUT virtual function of the associated DUT, workloads of the given test program process access and test the given DUT virtual function through a driver instance, of the plurality of driver instances, associated with the given DUT virtual function.

According to some embodiments, each driver instance of the plurality of driver instances of the host computer system further includes a controller handler, an interrupt handler, a queue for sending commands to a particular virtual function of a particular DUT, a queue for receiving responses back from the particular virtual function of the particular DUT, and computer resources for implementing the queues.

According to some embodiments, the plurality of drivers of the host computer system simulate functionality of a hypervisor.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Portions of the detailed description that follows are presented and discussed in terms of a method. Although steps and sequencing thereof are disclosed in a figure herein (e.g., FIG. 6) describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, parameters, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "associating," "identifying," "encoding," "labeling," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, algorithms, programs, objects, components, data structures, etc. that perform particular tasks or implement particular abstract data types. Typically the functionality of the program modules may be combined or distributed as desired in various embodiments.

Parallel Testing of Virtual Functions Across Multiple DUTS

Embodiments of the present invention can provide an extended NVMe driver that supports exercising virtual functions (and related physical functions) of a DUT without using a VM or hypervisor. In this way, the amount of memory and processing resources used for testing NVMe SSDs can be significantly reduced, and a large number of DUTs (e.g., up to 16 DUTs) can be tested in parallel independently. In other words, each DUT is tested in isolation, as if is the only device being tested, and there are no race conditions or competition for resources between workloads during testing.

Figure 1:
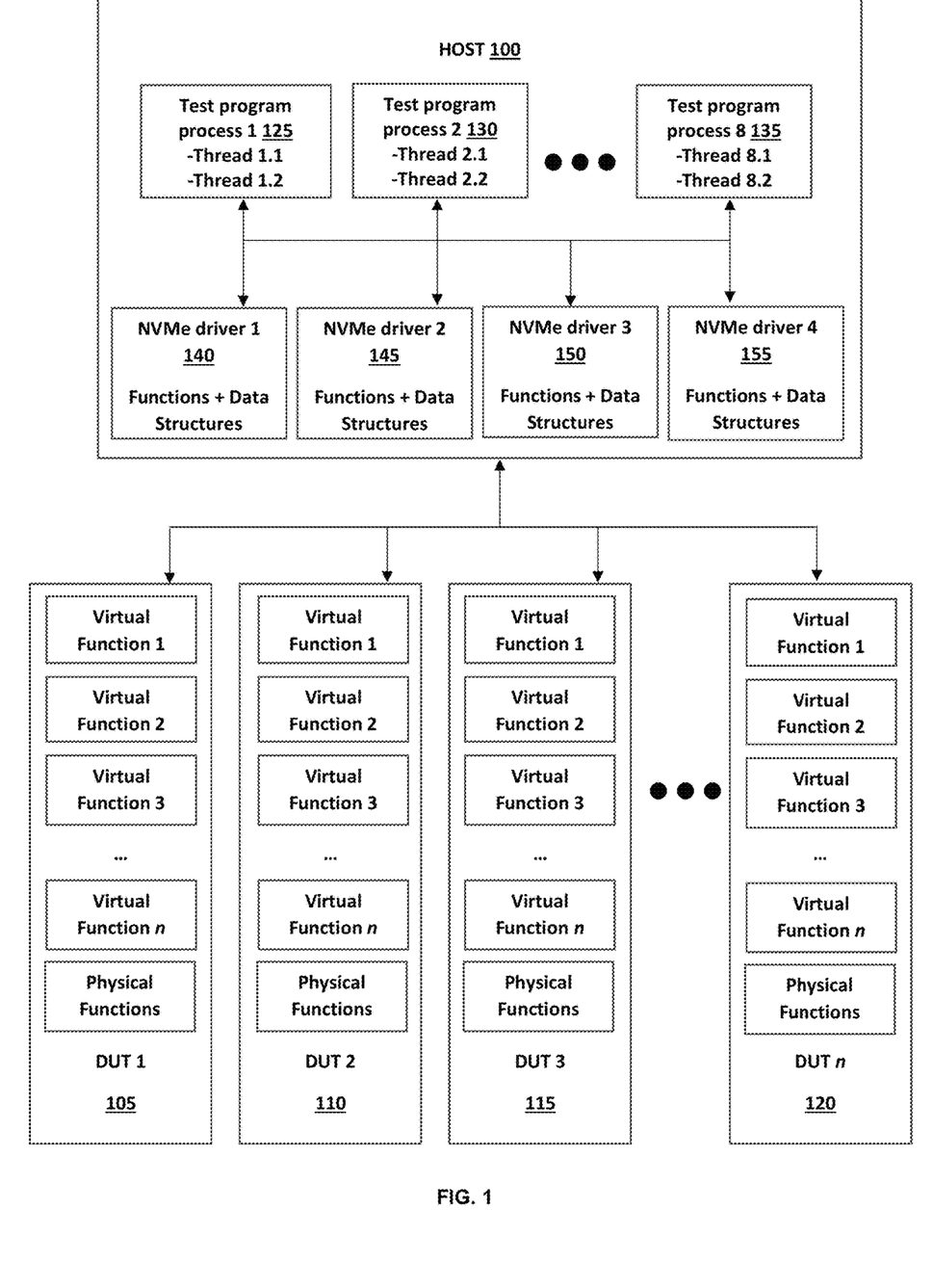
FIG. 1 is a block diagram of an exemplary test system in communication with multiple DUTs for parallel testing of virtual and physical functions of the DUTs using extended NVMe drivers executing commands of a workload generated by threads of test program processes executed on the test system according to embodiments of the present invention.

FIG. 1 depicts an exemplary host test system 100 (e.g., an ATE) coupled to DUTs 105, 110, 115, and 120. Fewer or additional DUTs (e.g., 16 DUTs) may be tested in parallel, according to embodiments. Host system 100 executes a test program that launches multiple test program processes 125, 130, and 135, using a plurality of threads for exercising virtual functions of DUTs 105, 110, 115, and 120 via NVMe drivers 140, 145, 150, and 155. NVMe drivers 140, 145, 150, and 155 are extended drivers that can advantageously test virtual functions of multiple DUTs in parallel without executing a VM or hypervisor to reduce overhead and complexity of testing. Furthermore, testing virtual functions of DUTs in parallel using extended NVMe drivers 140, 145, 150, and 155 can significantly improve performance during testing compared to traditional approaches.

The threads of the test programs are user level threads that generate workloads for testing the DUTs using a NVMe driver. For example, Thread 1.1 of test program process 1 (125) can generate a workload for exercising Virtual Function 1 of DUT 1 (105) using NVMe driver 1 (140), and Thread 1.2 can generate a workload for exercising Virtual Function 2 of DUT 1 (105) using NVMe driver 2 (145), etc. The workloads are executed independently and in isolation with no competition between devices for resources (e.g., memory, storage, etc.), and each driver can use an allocated data structure and other resources (e.g., interrupts and queues) for testing virtual functions of each DUT.

Testing the virtual functions may involve performing corresponding physical functions of the DUTs, and the test results may be returned to the corresponding test program process for evaluation. The physical functions of the DUTs are executed using dedicated local registers in each DUT that are accessible by host 100. Typically, the virtual functions can be thought of as smaller light-weight versions of the physical functions tested by host 100 (e.g., fewer attributes).

The extended NVMe drivers typically include functions/ routines and data structures instantiated for each virtual function to be tested, as well as physical resources allocated for testing (e.g., queues, interrupts, memory, etc.). According to some embodiments, the NVMe drivers include a controller handler for interfacing with an NVMe device, an interrupt handler, a queue for sending commands to a virtual function of a DUT, a queue for receiving responses back the DUT, and optionally other computer resources for implementing the queues, etc. Accordingly, the NVMe drivers can execute the functions/routines necessary to perform a workload based on the instantiated data structure. Moreover, the test program processes executed by the test program appear to be the sole user operating on said host computer system at any given time. In this way, the test system 100 can simulate a virtualization environment for said plurality of test program processes on said host computer system to test virtual functions of the DUTs separately, independently and concurrently, so that there is no competition for resources or need to execute a hypervisor or virtual machine.

The data structures can be used by the NVMe drivers to locate and enable virtual function the DUTs for testing. For example, each data structure can present access to a corresponding virtual function that is accessed by the NVMe drivers to perform workloads generated by the threads. Typically, a separate data structure is used to test virtual functions of each DUT. For example, to test 10 virtual functions of 16 DUTs in parallel, 160 data structures are instantiated. Moreover, data structures may be instantiated by the NVMe drivers for directly testing physical functions of DUTs (e.g., without testing a virtual function).

The threads are executed on the host 100 in user space and generate specific workloads that typically include combinations of NVMe commands (e.g., READ, WRITE, and administrative commands). The NVMe drivers service the request of the threads and issue commands to the corresponding device. According to some embodiments, multiple threads can be used to test a virtual function, using different workloads or commands, for example.

The NVMe drivers can also include one or more queues (e.g., NVMe queues, I/O queues), as well as a controller handler and namespace (advertised by the DUT) for accessing/modifying data stored on the DUTs during execution of the workload. The namespaces advertised by the DUT provide an access point for the threads to access the corresponding user space data using via an NVMe driver. In this way, 8 or even 16 DUTs can be tested in parallel independently without any competition between resources (e.g., race conditions) to test 64 or even 128 virtual functions of the DUTs.

Figure 2:
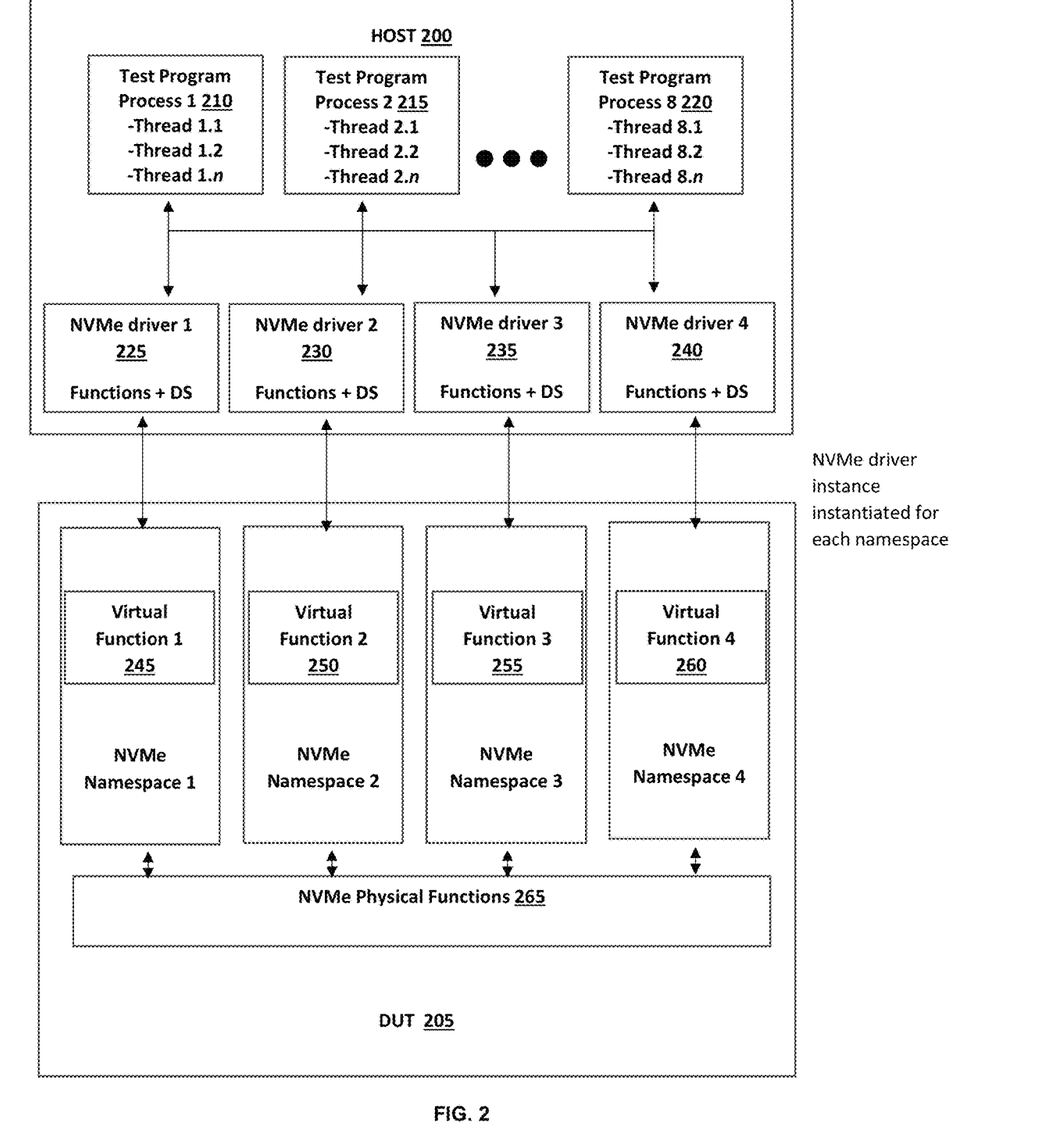
FIG. 2 is a block diagram of an exemplary test system in communication with DUTs for parallel testing virtual functions associated with namespaces of the DUTs using extended NVMe drivers according to embodiments of the present invention.

FIG. 2 is a block diagram of an exemplary host test system 200 capable of testing multiple virtual functions in parallel across multiple DUTs without using a hypervisor or virtual machine according to embodiments of the present invention. In the example of FIG. 2, a single DUT 205 is depicted for clarity. It should be understood that typically several DUTs are coupled to host system 200 for testing in parallel.

In the example of FIG. 2, host 200 executes a test program that launches multiple test program processes 210, 215, and 220. The test program processes 210, 215, and 220 execute multiple threads, each thread is typically associated with a different virtual function. Extended NVMe drivers are instantiated for testing of each namespace allocated to the virtual functions. The threads (e.g., threads 1.1, 2.1, 8.1, 8.*n*) generate workloads for a corresponding namespace to test virtual functions of the DUTs (e.g., virtual function 1, virtual function 2, virtual function 3, virtual function 4). Executing threads using test program processes 210, 215, and 220 to generate commands executed by extended NVMe drivers obviates the need for a hypervisor or virtual machines to significantly reduce testing complexity and overhead. According to some embodiments, multiple threads are used to test a virtual function, using different commands or workloads, for example.

As depicted in FIG. 2, virtual function 1 is allocated NVMe namespace 1, virtual function 2 is allocated NVMe namespace 2, etc. Testing the virtual functions of DUTs (e.g., DUT 205) using extended NVMe drivers 225, 230, 235, and 240 typically involves executing corresponding NVMe physical functions 265. Advantageously, the test program processes executed by the test program processes appear to be the sole user operating on said host computer system at any given time. In this way, the test system 200 can simulate a virtualization environment for said plurality of test program processes on said host computer system to test virtual functions of the DUTs separately, independently and concurrently, so that there is no competition for resources or need to execute a hypervisor or virtual machine.

Figure 3:
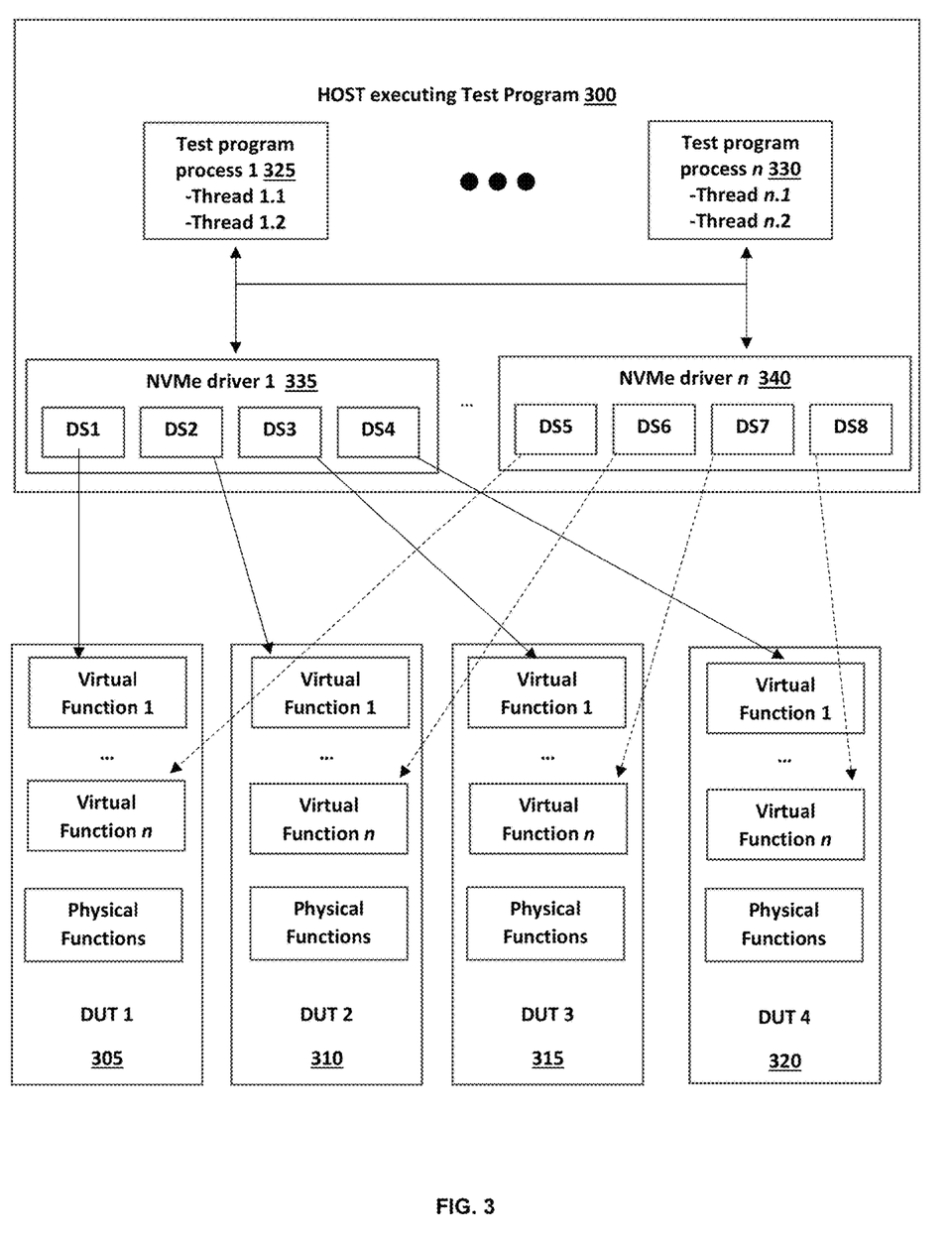
FIG. 3 is a block diagram of an exemplary test system in communication with multiple DUTs for parallel testing virtual functions using data structures instantiated by extended NVMe drivers according to embodiments of the present invention.

FIG. 3 is a block diagram of an exemplary test system 300 in communication with multiple DUTs 305, 310, 315, and 320 for parallel testing virtual functions using data structures instantiated by extended NVMe drivers according to embodiments of the present invention. As depicted in FIG. 3, a number of NVMe drivers (1–n) are instantiated to test a corresponding number of virtual functions of the DUTs, and each extended NVMe driver includes different data structures for performing the tests.

Testing the virtual functions typically includes executing corresponding physical functions of the DUTs based on workloads generated by test program processes executed by the test program executed on the host test system 300 (e.g., test program process 325 and 330). Importantly, each DUT instantiates a number of data structures corresponding to different virtual functions. For example, to test 10 virtual functions of 16 DUTs (n=16) in parallel, 160 data structures can be instantiated.

In the example of FIG. 3, NVMe drivers 335 and 340 each instantiate 4 data structures to test corresponding virtual functions of DUTs 305, 310, 315, and 320. Specifically, NVMe driver 1 (335) tests virtual function 1 of DUTs 305, 310, 315, and 320 using data structures 1, 2, 3, and 4, respectively, and NVMe driver n (330) tests virtual function n of DUTs 305, 310, 315, and 320 using data structures 5, 6, 7, and 8, respectively. By using the different data structures to test workloads generated by the test program processes, the host test system 300 can simulate a virtualization environment for said plurality of test program processes on said host computer system to test virtual functions of the DUTs separately, independently and concurrently, so that there is no competition for resources or need to execute a hypervisor or virtual machine.

Figure 4:
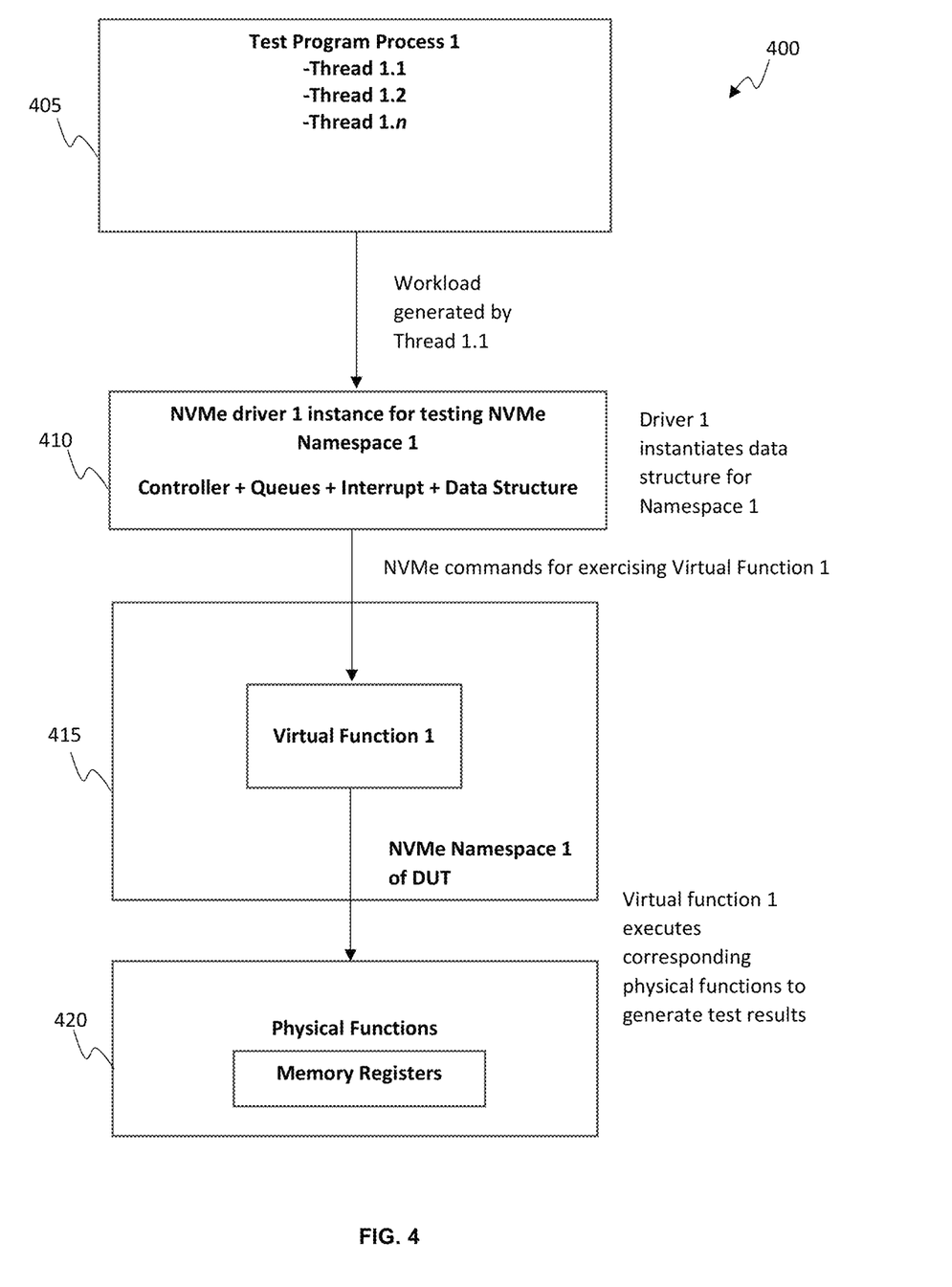
FIG. 4 is a block diagram and data flow diagram for testing virtual and physical functions of DUTs using an extended NVMe driver according to embodiments of the present invention.

FIG. 4 is a block diagram and data flow diagram 400 for testing virtual and physical functions of DUTs using an extended NVMe driver according to embodiments of the present invention. In step 405 of data flow diagram 400, test program process 1 executes multiple threads that generate workloads for testing virtual functions of DUTs. At step 410, NVMe driver 1 receives the workload generated by thread 1.1 of test program process 1 to test virtual function 1 of an NVMe device. As depicted in FIG. 4, virtual function 1 is allocated namespace 1 in user space of the NVMe device.

The NVMe driver 1 instantiates a data structure for testing namespace 1, and the driver can include a controller handler for interfacing with the NVMe device, one or more queues (e.g., I/O queues), an interrupt handler for controlling operation of the NVMe driver by the CPU, and optionally other computing resources used to carry out testing. At step 415, the DUT executes virtual function 1 according to the NVMe commands received from NVMe driver 1 instantiated to test virtual function 1. Executing virtual function 1 typically involves performing one or more physical functions that accesses memory registers of the NVMe device. In this way, test results can be generated by exercising various functions of the DUT, and the results can be returned to the host computer system executing test program process 1 without using a hypervisor or virtual machine, which significantly reduces overhead and complexity of testing. Moreover, the steps of dataflow diagram 400 can be performed by multiple test program processes and multiple threads concurrently to test multiple DUTs in parallel using a single host computer test system.

Figure 5:
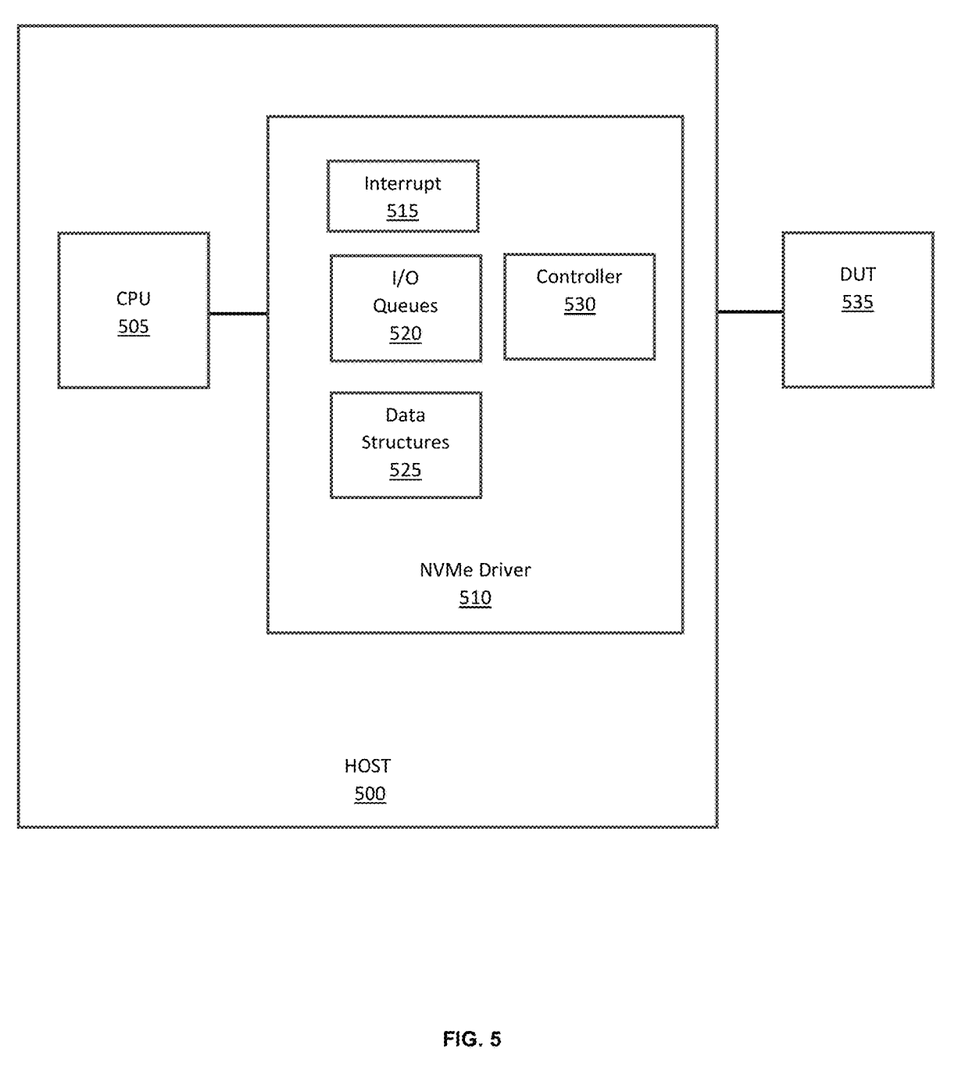
FIG. 5 is a block diagram of an exemplary extended NVMe driver according to embodiments of the present invention.

FIG. 5 is a block diagram of an exemplary NVMe driver 510 instantiated in memory of a host computer 500 for testing virtual and physical functions of DUT 535 without using a virtual machine or hypervisor according to embodiments of the present invention. DUT 535 can be disposed in a socket of a test interface board with other DUTs for testing in parallel, for example. Multiple NVMe drivers 510 can be executed by host computer 500 to test multiple virtual functions of the DUTs in parallel using threads executed by CPU 505. CPU 505 executes a test program that includes multiple test program processes for generating the threads to produce different workloads performed by DUT 535 according to commands sent by controller handler 530 of NVMe driver 510. As depicted in FIG. 5, NVMe driver 510 includes an interrupt handler 515 for receiving interrupts from CPU 505, one or more queues 520, such as queues for sending and receiving data and NVMe commands to/from DUT 535, and data structures 525 for executing the workloads within a virtualization environment.

Figure 6:
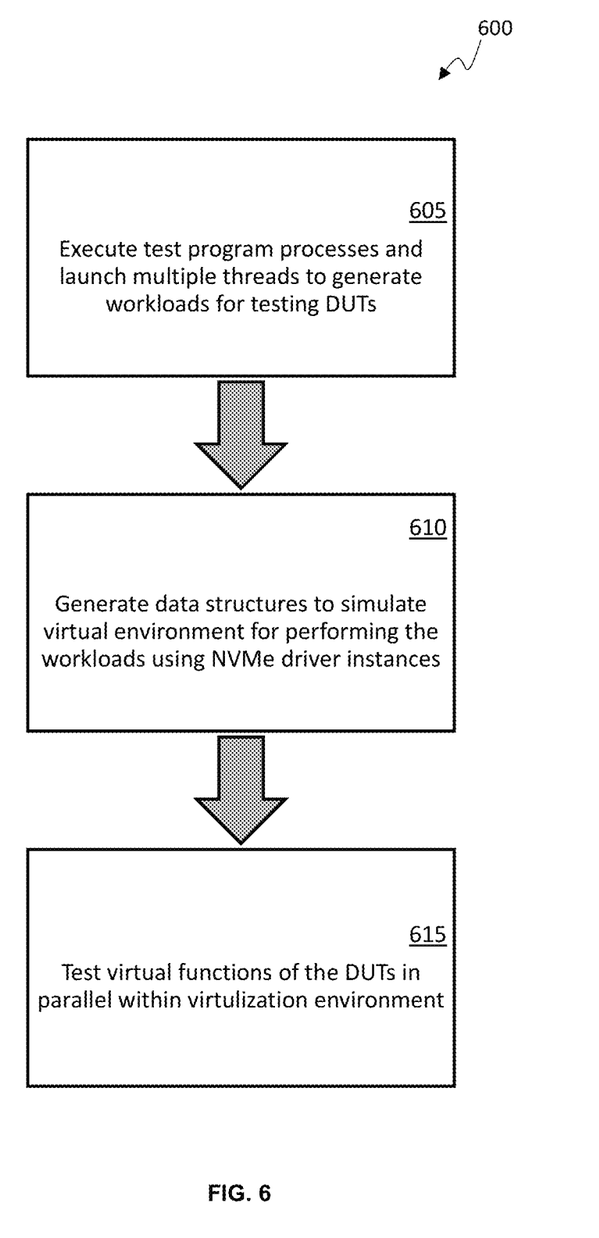
FIG. 6 is a flow chart depicting an exemplary sequence of computer implemented steps for testing virtual functions of a DUT using extended NVMe drivers according to embodiments of the present invention.

FIG. 6 is a flow chart depicting an exemplary process 600 for testing virtual and physical functions of NVMe devices using an extended NVMe driver according to embodiments of the present invention. Process 600 can be performed without executing a hypervisor or virtual machine to test the virtual functions.

At step 605, a host system executes a test program for testing multiple connected DUTs in parallel. The host system typically includes memory and a CPU. The test program executes multiple test program processes for testing the DUTs by launching threads for testing different virtual functions of the associated DUT. Each thread can be used to test a different virtual function (or physical function) of the DUT, for example.

At step 610, the host system simulates a virtual environment (similar to a virtual machine that uses a hypervisor to create and manage virtual machines) for testing virtual functions of the DUTs using NVMe device drivers instantiated in the memory of the host system. The NVMe device drivers instantiated in the memory of the host system include different data structures generated for the different virtual functions. Typically there is one data structure for each virtual function (or namespace) of the DUTs to be tested, and the virtual functions are tested on the DUTs separately, independently and concurrently within the virtualization environment.

At step 615, the host system exercises various functions of the DUTs in parallel according to the test program within the virtualization environment.

Exemplary Test System

Embodiments of the present invention are drawn to electronic systems for testing virtual functions of an NVMe device without using a hypervisor or virtual machine to reduce complexity and overhead during testing. A single test system can execute test programs that launch multiple threads for testing virtual functions of DUTs using extended NVMe drivers. Each DUT can be tested independently in isolation from the other DUTs without competing for time or resources according to workloads generated by the threads using data structures instantiated by the NVMe drivers for the corresponding virtual function. The virtual functions access user space data of a DUT corresponding to a namespace accessible to an NVMe driver.

Figure 7:
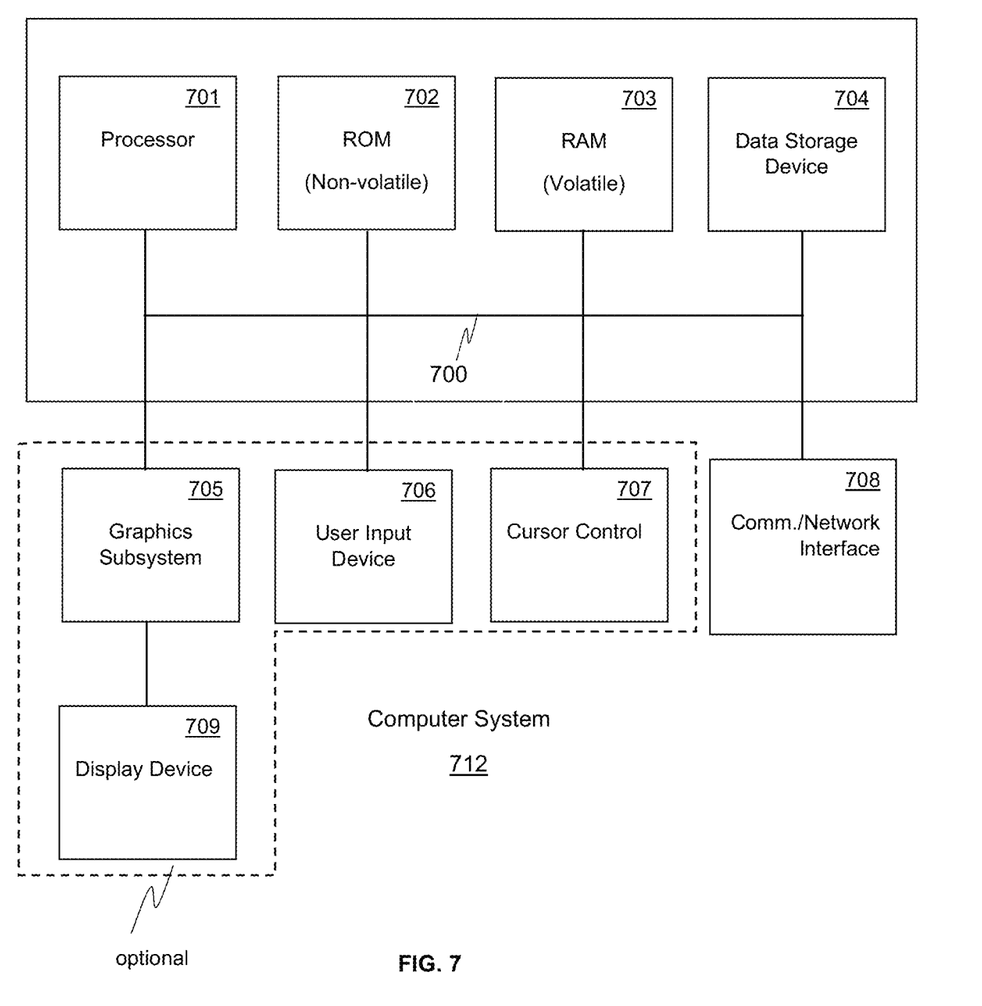
FIG. 7 depicts an exemplary test computer system platform upon which embodiments of the present invention may be implemented.

In the example of FIG. 7, the exemplary test computer system 712 includes a central processing unit (CPU) 701 for running software applications and an operating system. Random access memory 702 and read-only memory 703 store applications and data for use by the CPU 701. CPU 701 can instantiate NVMe drivers (FIG. 5) and data structures for testing the virtual functions and physical functions of a DUT in memory 702, and can send commands to the DUT (or test interface boards, etc.) using a controller handler allocated to an NVMe driver to communicate with the DUT.

Data storage device 704 provides non-volatile storage for applications and data and may include fixed disk drives, removable disk drives, flash memory devices, and CD-ROM, DVD-ROM or other optical storage devices. The data storage device 704 or the memory 702/703 can store historic and real-time testing data (e.g., test results, limits, computations, etc.).

The optional user inputs 706 and 707 comprise devices that communicate inputs from one or more users to the computer system 712 (e.g., mice, joysticks, cameras, touch screens, keyboards, and/or microphones). A communication or network interface 708 allows the computer system 712 to communicate with other computer systems, networks, or devices via an electronic communications network, including wired and/or wireless communication and including an Intranet or the Internet.

The optional display device 710 may be any device capable of displaying visual information, e.g., the final scan report, in response to a signal from the computer system 712 and may include a flat panel touch sensitive display, for example. The components of the computer system 712, including the CPU 701, memory 702/703, data storage 704, user input devices 706, and graphics subsystem 705 may be coupled via one or more data buses 700.

Embodiments of the present invention are thus described. While the present invention has been described in particular embodiments, it should be appreciated that the present invention should not be construed as limited by such embodiments, but rather construed according to the following claims.

What is claimed is:

1. A tester system for testing a plurality of DUT virtual functions of a plurality of DUTs, the tester system comprising:
    a host computer system comprising a memory, wherein said memory comprises a plurality of test program processes operable to execute concurrently and wherein a respective test program process of said plurality of test program processes is associated with each DUT of said plurality of DUTs and wherein further, each test program process of said plurality of test program processes comprises a plurality of threads for generating workloads for testing DUT virtual functions of an associated DUT; and
    a plurality of driver instances instantiated within said memory, each driver of said plurality of driver instances operable to enable testing of an associated DUT virtual function on said plurality of DUTs, and wherein further each driver instance comprises a plurality of data structures, a respective data structure for each DUT of said plurality of DUTs, to enable testing of respective DUT virtual functions on said plurality of DUTs and wherein further said plurality of driver instances are operable to simulate a virtualization environment for said plurality of test program processes on said host computer system to test DUT virtual functions of said plurality of DUTs separately, independently and concurrently wherein any given test program process of said plurality of test program processes appears to be a sole user operating on said host computer system at any given time.

2. A tester system as described in claim 1 wherein each data structure of each driver of said plurality of driver instances operates to:
  locate and enable its associated DUT virtual function on an associated DUT; and
  present access to said associated DUT virtual function on said associated DUT to the host computer system and is used by a test program process of said host computer system to access and test said associated DUT virtual function on said associated DUT.

3. A tester system as described in claim 2 wherein, for a given test program process, the associated DUT, and a given DUT virtual function of said associated DUT, workloads of said given test program process access and test said given DUT virtual function through a driver, of said plurality of driver instances, associated with said given DUT virtual function.

4. A tester system as described in claim 1 wherein each driver of said plurality of driver instances of said host computer system further comprises:
  a controller handler;
  an interrupt handler;
  a first queue for sending commands to a particular virtual function of a particular DUT;
  a second queue for receiving responses back from said particular virtual function of said particular DUT; and
  computer resources for implementing said first queue and said second queue.

5. A tester system as described in claim 1 wherein said plurality of DUTs are solid state drives (SSDs).

6. A tester system as described in claim 1 wherein said plurality of driver instances comprise NVMe device drivers.

7. A tester system as described in claim 1 wherein said plurality of drivers instances of said host computer system simulate functionality of a hypervisor.

8. A tester system as described in claim 7 wherein said host computer system is free of virtual machine software.

9. A tester system for testing a plurality of virtual functions of a first and a second DUT, the tester system comprising:
  a host computer system comprising a memory, wherein said memory comprises a first and a second test program process operable to execute concurrently and wherein said first test program process is operable to test virtual functions of said first DUT and wherein said second test program process operable to test virtual functions of said second DUT and wherein further said first test program process comprises a first plurality of threads for generating workloads to test said virtual functions of said first DUT and wherein said second test program process comprises a second plurality of threads for generating workloads to test said virtual functions of said second DUT; and
  a plurality of drivers instantiated within said memory, each driver of said plurality of drivers operable to enable testing of an associated virtual function on said first and second DUTs, and wherein further each driver comprises a first data structure for testing said associated virtual function on said first DUT and a second data structure for testing said associated DUT virtual function on said second DUT and wherein said plurality of drivers are operable to simulate a virtualization environment on said host computer system for said first and second test program processes to test virtual functions of said first and second DUTs separately, independently and concurrently wherein each test program process of said first and second test program processes appears to be a sole test program process operating on said host computer system.

10. A tester system as described in claim 9 wherein said first data structure of each driver of said plurality of drivers operates to:
  locate and enable an associated virtual function on said first DUT; and
  present access to said associated virtual function on said first DUT to the host computer system, wherein said first test program process of said host computer system is operable to access and test said associated virtual function on said first DUT.

11. A tester system as described in claim 10 wherein said second data structure of each driver of said plurality of drivers operates to:
  locate and enable an associated virtual function on said second DUT; and
  present access to said associated virtual function on said second DUT to the host computer system and is used by said second test program process of said host computer system to access and test said associated virtual function on said second DUT.

12. A tester system as described in claim 9 wherein each driver of said plurality of drivers of said host computer system further comprises:
  a controller handler;
  an interrupt handler;
  a first queue for sending commands to a particular virtual function of a particular DUT;
  a second queue for receiving responses back from said particular virtual function of said particular DUT; and
  computer resources for implementing said first and second queues.

13. A tester system as described in claim 9 wherein said first and second DUTs comprise solid state drives (SSDs).

14. A tester system as described in claim 9 wherein said plurality of drivers comprise NVMe device drivers.

15. A tester system as described in claim 9 wherein said plurality of drivers of said host computer system simulate functionality of a hypervisor.

16. A tester system as described in claim 15 wherein said host computer system is free of virtual machine software.

17. A method of testing a plurality of DUT virtual functions of a plurality of DUTs using a tester system, the method comprising:
  on a host computer system comprising a memory, concurrently executing a plurality of test program processes wherein a respective test program process of said plurality of test program processes is associated with each DUT of said plurality of DUTs and wherein further, each test program process of said plurality of test program processes comprises a plurality of threads for generating workloads for testing DUT virtual functions of an associated DUT; and simulating a virtualization environment for said plurality of test program processes on said host computer system using a plurality of drivers instantiated within said memory, wherein said plurality of DUT virtual functions are operable to be tested on said plurality of DUTs separately, independently and concurrently within said virtualization environment and wherein any given test program process of said plurality of test program processes appears to be a sole user operating on said host computer system at any given time; and wherein each driver of said plurality of drivers is operable to enable testing of an associated DUT virtual function on said plurality of DUTs, and wherein further each driver of said plurality of drivers comprises a plurality of data structures, a respective data structure for each DUT of said plurality of DUTs, to enable testing of said respective DUT virtual function on said plurality of DUTs.

18. A method of testing as described in claim 17 further comprising using each data structure of each driver of said plurality of drivers for:

locating and enabling its associated DUT virtual function on an associated DUT; and presenting access to said a given DUT virtual function on said associated DUT to the host computer system, wherein a test program process of said host computer system to operable to access and test said associated DUT virtual function on said associated DUT.

19. A method of testing as described in claim 18 wherein, for a given test program process and an associated DUT and a given DUT virtual function of said associated DUT, workloads of said given test program process access and test said given DUT virtual function through a driver, of said plurality of drivers, associated with said given DUT virtual function.

20. A method of testing as described in claim 17 wherein each driver of said plurality of drivers of said host computer system further comprises:

a controller handler;

an interrupt handler;

a first queue for sending commands to a particular virtual function of a particular DUT;

a second queue for receiving responses back from said particular virtual function of said particular DUT; and computer resources for implementing said first queue and said second queue.

21. A method of testing as described in claim 17 wherein said plurality of drivers of said host computer system simulate functionality of a hypervisor.

* * * * *